United States Patent [19]

Yeh et al.

[11] 4,206,005
[45] Jun. 3, 1980

[54] METHOD OF MAKING SPLIT GATE LSI VMOSFET

[75] Inventors: Keming W. Yeh, Los Angeles; James L. Reuter, Rancho Palos Verdes, both of Calif.

[73] Assignee: Xerox Corporation, Stamford, Conn.

[21] Appl. No.: 963,880

[22] Filed: Nov. 27, 1978

[51] Int. Cl.² .................. H01L 27/02; H01L 27/04; H01L 29/06
[52] U.S. Cl. ............................... 148/1.5; 148/187; 357/23; 357/55; 357/91
[58] Field of Search ................... 148/1.5, 187; 357/23, 357/55, 91

[56] References Cited

U.S. PATENT DOCUMENTS

| | | | |
|---|---|---|---|
| 4,003,036 | 1/1977 | Jenne | 340/173 R |
| 4,037,306 | 7/1977 | Gutteridge et al. | 29/577 |
| 4,047,195 | 9/1977 | Allison | 357/55 |
| 4,047,975 | 9/1977 | Widman | 148/1.5 |
| 4,065,783 | 12/1977 | Ouyang | 357/41 |
| 4,084,175 | 4/1978 | Ouyang | 357/55 |
| 4,109,270 | 8/1978 | Von Basse et al. | 357/23 |
| 4,116,720 | 9/1978 | Vinson | 148/1.5 |
| 4,119,996 | 10/1978 | Jhabvala | 357/23 |
| 4,126,881 | 11/1978 | Von Basse et al. | 357/55 |
| 4,131,907 | 12/1978 | Ouyang | 357/42 |

*Primary Examiner*—L. Dewayne Rutledge
*Assistant Examiner*—Upendra Roy
*Attorney, Agent, or Firm*—Ronald L. Taylor

[57] ABSTRACT

A split gate VMOSFET having an enhancement transistor and a depletion load transistor on opposing sidewalls of a V-groove region. In the process, a differential oxidation rate due to the different crystal orientations of the substrate is used to complete device fabrication in a relatively simple manner. The resultant process steps make it possible to fabricate a VMOSFET having symmetrical geometry in which a transfer gate can be easily implemented.

30 Claims, 25 Drawing Figures

METHOD OF MAKING SPLIT GATE LSI VMOSFET

CROSS REFERENCE TO RELATED APPLICATION

An application titled "Split Gate V-Groove FET" having U.S. Ser. No. 873,333 now U.S. Pat. 4,163,988 invented by Keming W. Yeh and Assigned to Xerox Corporation discloses and claims a device for which the process of the present invention is used to fabricate.

BACKGROUND OF THE INVENTION

1. Field of the Invention

The invention relates generally to the field of semiconductors and specifically to fabrication processes for VMOSFET.

2. Prior Art

In order to fabricate high density, high speed integrated circuits for future sophisticated, but compact products, new technologies are required. One possible technology was VMOS, but the prior art of making standard VMOS had processing difficulties and limited potential for making high performance sealed-versions of VMOS devices. A new VMOS device called split gate VMOS, as disclosed and claimed in the supra cross-referenced application, was invented to resolve the above problems and add circuit design flexibility. As such, a simple and practical process to fabricate this new invention was needed.

SUMMARY OF THE INVENTION

Accordingly, it is an object of the present invention to include the process of fabricating a split gate VMOSFET that has symmetrical geometry thereby facilitating implementation of a transfer gate.

A further object of the present invention includes the process of differential oxidation rates due to different substrate crystal orientations to complete device fabrication in a relatively simple manner.

Yet another object of the present invention includes the fabrication of double diffused VMOS by diffusing p-type into a substrate followed by n-type dopant through the bottom area of the V-groove region resulting in shorter channel regions with higher device gain and high speed capability.

A yet further object of the present invention includes the control of short channel region length through silicon etching.

Yet another further object of the present invention includes the ability to fabricate two transistors in one V-groove region.

Yet but another object of the present invention includes the ability to define the buried contact using a non-critical mask insomuch as the doped polycrystalline silicon is used as the doping source.

Yet but another further object of the present invention includes the absence of a masking step to define the tops areas and bottom area of the V-groove region.

Another but further object of the present invention includes the relatively extremely small gate size that may be achieved due to the relatively compact gate-unit layout.

A yet but further object of the present invention includes the equivalency of mask steps to fabricate the VMOSFET relative to a planar NMOS process.

BRIEF DESCRIPTION OF THE DRAWINGS

FIG. 71A is a cross-sectional view of the silicon dioxide introduction fifteenth step for the VMOSFET of FIG. 1;

DESCRIPTION OF THE PREFERRED EMBODIMENT

Figure 1:
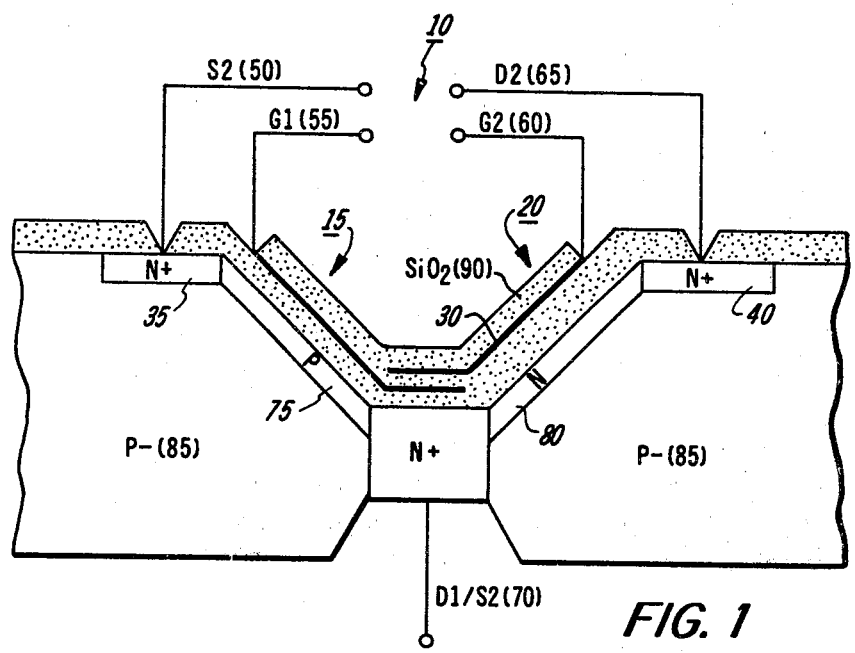
FIG. 1 is a componetized cross-sectional view of a split gate VMOSFET according to the invention.

A split gate LSI VMOS FET (hereinafter VMOSFET) is shown generally as 10 in FIG. 1. According to the invention, the component parts form two transistors 15 and 20, enhancement and depletions devices, shown as having gates for gate areas G1 and G2 25 and 30 respectively that are split or non common, and spatially overlap. Additionally, forming part of transistors 15 and 20 is source (or source area) S1 35 and drain (or drain area) D2 40 respectively. Transistors 15 and 20 have a drain (or drain area) and source (or source area) 45 D1/S2 that is common as to each other. Electrodes for source 35, gate 25, gate 30, drain 40 and common drain-source 45 are 50, 55, 60, 65 and 70 respectively. Transistors 15 and 20 have a p-type and a n-type channel region 75, 80 respectively. The substrate for the transistors 15 and 20 is a p minus (p—) type material 85. The surface covering for the transistors 15 and 20 is silicon dioxide (SiO2) 90. The VMOSFET 10 comprises a two transistor circuit having an enhancement device or transistor 15 and a depletion (load) device or transistor 20 of the VMOSFET 10 as shown schematically in FIG. 2.

Figure 2:
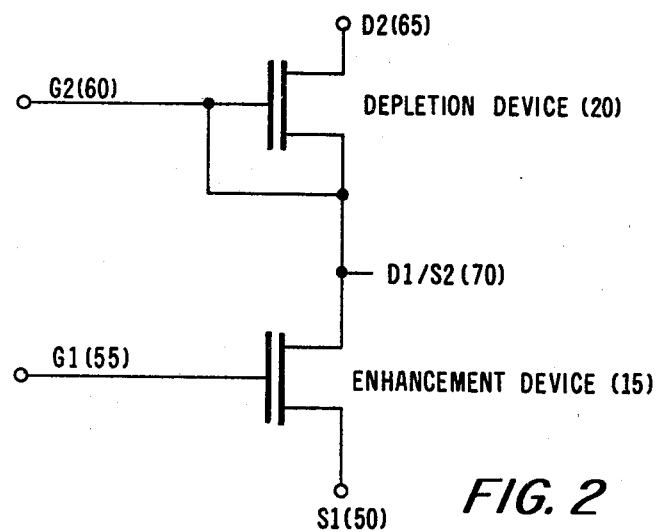
FIG. 2 is a schematic view of the split gate VMOSFET of FIG. 1.

The process for fabricating the split gate LS1 VMOS FET 10 as shown componently in cross-section in FIG. 1 and schematically in FIG. 2 is described in detail in the infra steps.

Figure 3:
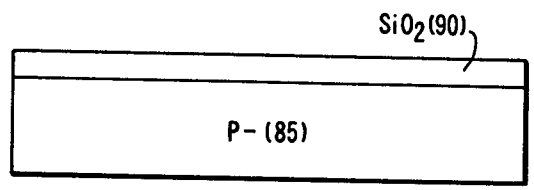
FIG. 3 is a cross-sectional view of the initial oxidation first step for the VMOSFET of FIG. 1.

In the first step of the process, as shown in FIG. 3, starting with a bar of semiconductor substrate 85 or silicon in the preferred embodiment that has been doped to be p—, initial oxidation is made to grow a layer, to a predetermined depth, of thermal silicon dioxide (SiO2) 90 at a relatively high temperature for a predetermined time, of a half hour in the preferred embodiment, on the surface of the substrate 85. The preferred predetermined depth in the embodiment is approximately 400 angstroms. The substrate 85 depth, in the preferred embodiment, has resistivity of approximately 15 ohm centimeters.

Figure 4:
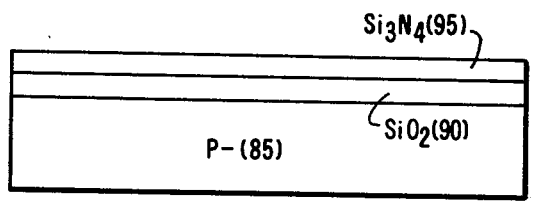
FIG. 4 is a cross-sectional view of the nitride deposition second step for the VMOSFET of FIG. 1.

In the second step of the process, as shown in cross-sectional view FIG. 4, silicon nitride (Si3N4) or an equivalent is introduced as a layer 95, to a predetermined depth over the silicon dioxide layer 90. In this embodiment, the introduction is by nitride depositing and the preferred predetermined depth is in this embodiment approximately 1000 angstroms.

Figure 5:
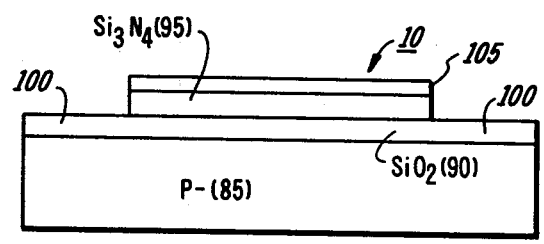
FIG. 5 is a cross-sectional view of the photo process third step for the VMOSFET of FIG. 1.

In the third step of the process, as shown in cross sectional view FIG. 5, a photo process using a mask is operative to open field regions 100 by leaving a layer of photo resist 105 at an approximate area where the VMOS FET 10 will be created infra. Next, the exposed field regions 100 of the Si3N4 layer 95 are etched away down to the SiO2 layer 90.

Figure 6:
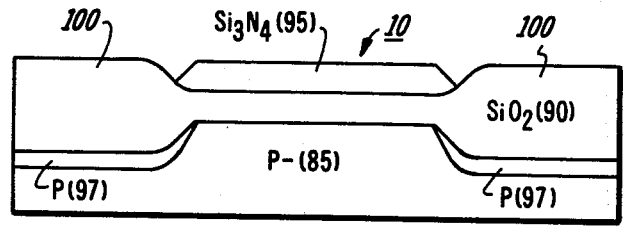
FIG. 6 is a cross-sectional view of the p-type impurity introduction fourth step for the VMOSFET of FIG. 1.

In the fourth step of the process, as shown in cross-sectional view FIG. 6, a p-type impurity, such as Boron in the preferred embodiment, is introduced at areas 97 by a method such as implanting in the field regions 100 as a field-inversion stopper. At this point, the photo resist layer 105 is stripped. Next, field oxidation is used to grow SiO2 90 in the field regions 100 to a preferred predetermined depth which in this embodiment is approximately 1.0 micrometers.

Figure 7:
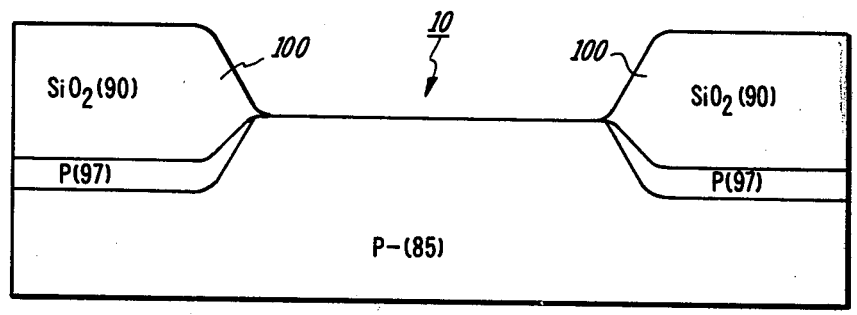
FIG. 7 is a cross-sectional view of the etching fifth step for the VMOSFET of FIG. 1.

In the fifth step of the process, as shown in cross-sectional view FIG. 7, the Si3N4 layer 95 and SiO2 initial oxidation layer 95 in the area where the VMOSFET 10 is to be formed, or V-groove region is to be created, is etched away leaving the p minus substrate 85 exposed thereat.

Figure 8:
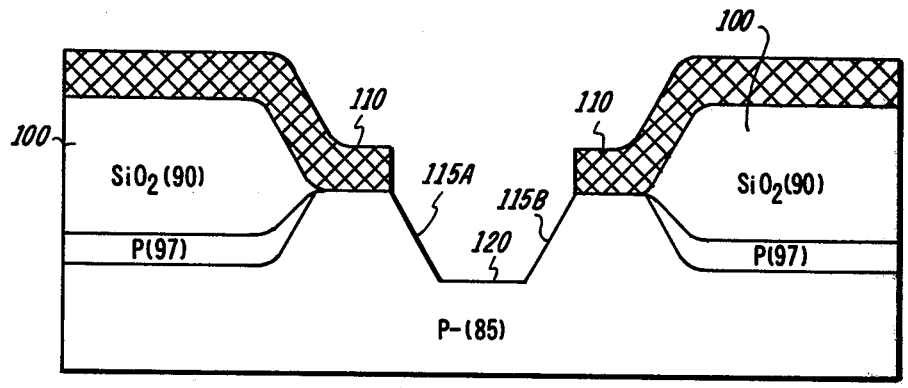
FIG. 8 is a cross-sectional view of the photo process sixth step for the VMOSFET of FIG. 1.

In the sixth step of the process, as shown in cross-sectional view FIG. 8, a photo process by mask is used to define the exact area of exposed p minus substrate 85 for the v-groove region for the VMOSFET 10 where a photoresist layer is to be applied to the surface of all other areas not so exposed. The exposed area of the p minus substrate 85 for the VMOSFET 10 is etched away leaving a v-groove having top areas 110A-B, sidewall areas 115A and B, and bottom area 120. The supra etching is by a conventional wet chemical process or alternatively by a dry plasma process. It will be noted that the V-groove depth for VMOSFET 10 determines channel length for infra described channel regions 75 and 80. Short channel length of infra regions 75 and 80 is controlled by silicon etching away to form the V-groove as described supra which is for better control than by using a conventional impurity out-diffusion for controlling channel length as in prior art VMOS since they had no bottom area 120 unlike the present invention. It will be further noted that the surface area for the V-groove of VMOSFET is relatively small thereby allowing a relatively smaller gate size.

Figure 9:
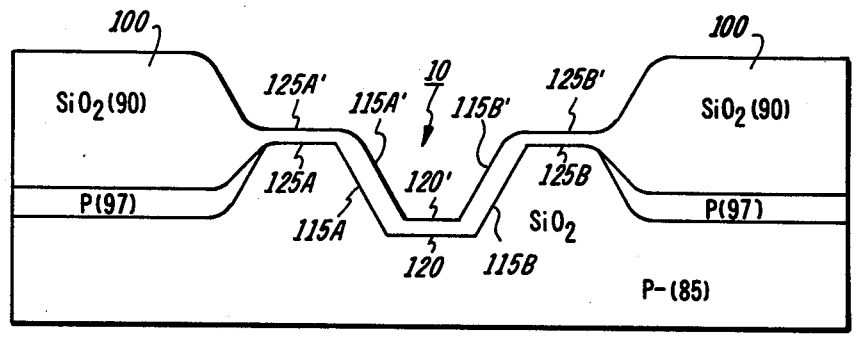
FIG. 9 is a cross-sectional view of the photoresist stripping seventh step for the VMOSFET of FIG. 1.

In the seventh step of the process, as shown in cross-sectional view FIG. 9, the photoresist layer 110 is then stripped from the surface of the areas 50 applied in supra step six. Next, a relatively low temperature oxidation is used, in the preferred embodiment, to grow relatively thin SiO2 at areas 125A-B'115A-B' and 120' to a predetermined depth on the top areas 125A-B, sidewall areas 115A-B and bottom area 120 respectively of the V-groove for the VMOSFET 10. The preferred predetermined depth for the SiO2 are areas 115A'-B' and 120' is in this embodiment approximately 1000 angstroms.

Figure 10:
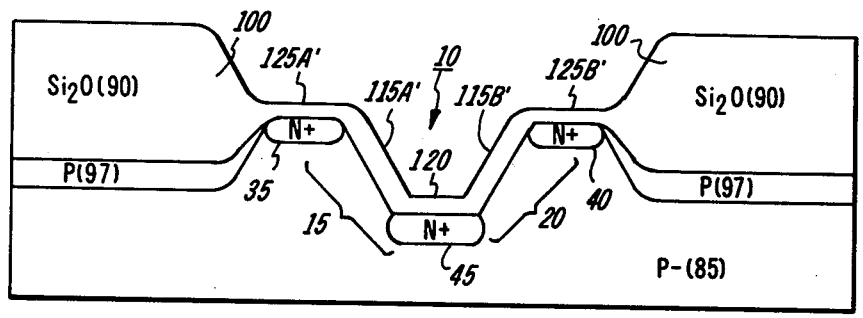
FIG. 10 is a cross-sectional view of the silicon dioxide stripping eighth step for the VMOSFET of FIG. 1.

In the eighth step of the process, as shown in cross-sectional view FIG. 10, the relatively thin SiO2 at areas 125A'-B', 115A'-B' and 120' is stripped off the crystal orientation 100 surface faces leaving relatively thin SiO2 areas 125A'-B', 115A'-B' and 120' on the crystal orientation 111 surface faces as presentations or introductions, such as implant masks in the preferred embodiment, relative to the p minus substrate 85. It will be noted that the supra stripping is optional insomuch as the differential oxidation rate is relatively greater for crystal orientation 111 than for crystal orientation 100. The surface faces refer to crystal orientation on the HKL plane relative to a substrate such as 85. The HKL plane, as commonly used in the art, uses a reverse space dimension (1/cm$^2$) where crystal orientation 100 approximates the X-axis, crystal orientation 010 approximates the Y-axis and crystal orientation 001 approximates the Z-axis. Next, relatively heavy n-type impurity presentations or introductions, such as implants in the preferred embodiment, are used to form N+ areas through relatively high temperature drive-in's. N+ areas formed include an N+ source area (S1) 35 for the first transistor 15 an N+ source-drain area (S2/D1) 45 combinably for the second 20 and first transistor 15 respectively, and an N+ drain area (D2) 40 for the second transistor 20. It will be appreciated that no masking step was required for N+ areas 35, 40, and 45 thereby further facilitating the case of processing of the VMOSFET 10.

Figure 11A:
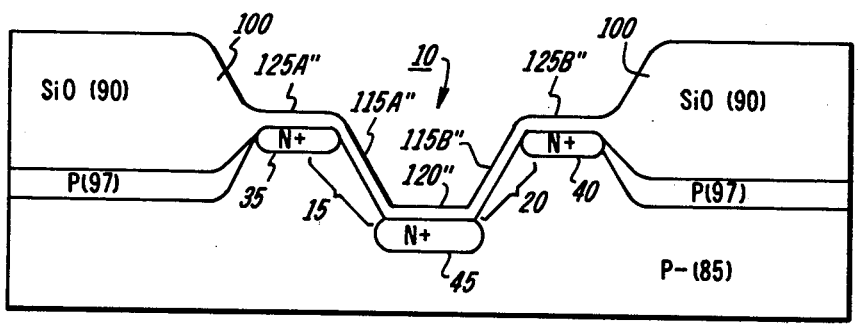
FIG. 11A is a cross-sectional view of the removal nineth step for the VMOSFET of FIG. 1.
Figure 11B:
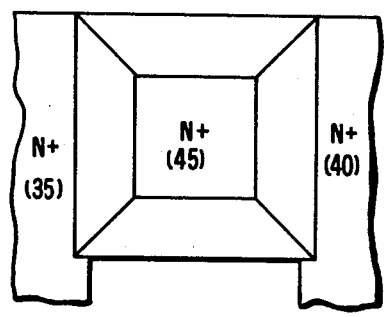
FIG. 11B is an overhead view of the removal nineth step for the VMOSFET of FIG. 1.

In the ninth step of the process, as shown in cross-sectional view FIG. 11A and in overhead view FIG. 11B, the relatively thin SiO2 areas 115A'-B', 120' and 125A-'-B' are removed by a mask and etching process in the preferred embodiment. Next, reoxidation at a relatively high temperature to regrow SiO2, via oxidation in the preferred embodiment, as a first gate oxide to a predetermined depth at sidewall areas 115A''-B'', bottom area 120'', and top areas 125A''-B'' that are in relative loco situs to supra areas 115A'-B', 120', and 125A'-B'. The preferred predetermined depth of the SiO2 areas 115A''-B'', 120'' and 125A''-B'' in this embodiment approximate 1000 angstroms. It will be noted that areas 120'' and 125A''-B'' are less than 1000 angstroms thickness whereas areas 115A''-B'' are greater than 1000 angstroms of thickness due to relatively slow oxidation and fast oxidation respectively thereon.

Figure 12A:
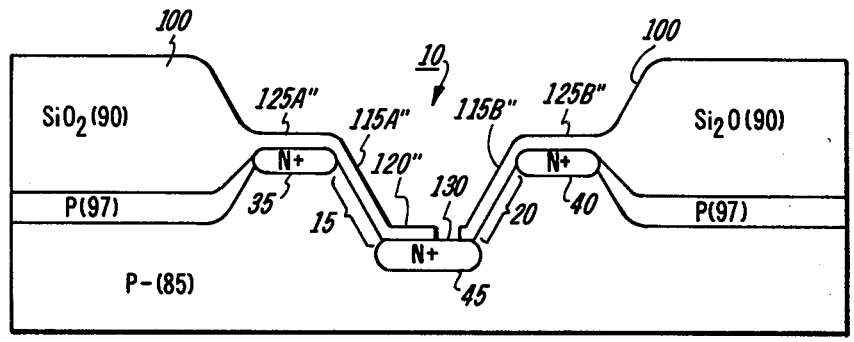
FIG. 12A is a cross-sectional view of the buried contact tenth step for the VMOSFET of FIG. 1.
Figure 12B:
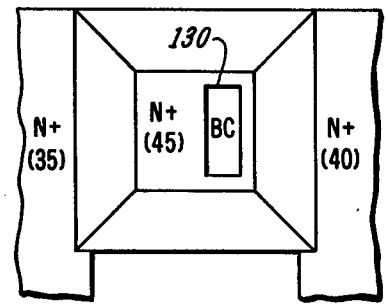
FIG. 12B is an overhead view of the buried contact tenth step for the VMOSFET of FIG. 1.

In the tenth step of the process, as shown in cross-sectional view FIG. 12A and in overhead view FIG. 12B, a buried contact (BC) 130, is opened through masking in the SiO2 bottom area 120" to expose a portion of the S2/D1 N+ area 45.

Figure 13A:
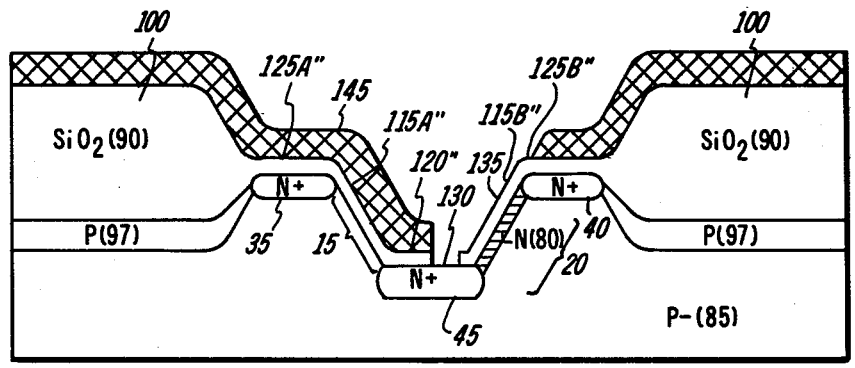
FIG. 13A is a cross-sectional view of the photo process eleventh step for the VMOSFET of FIG. 1.
Figure 13B:
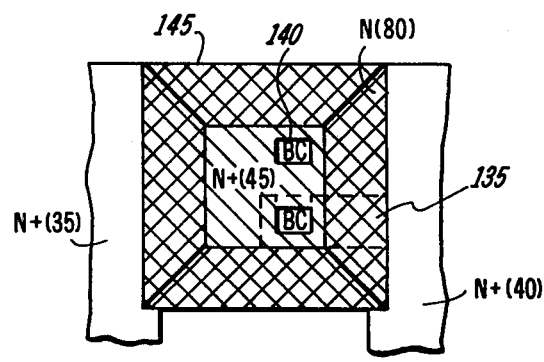
FIG. 13B is an overhead view of the photo process eleventh step for the VMOSFET of FIG. 1.

In the eleventh step of the process, as shown in cross-sectional view FIG. 13A and in overhead view FIG. 13B, a photo process with masking is used to block with a photoresist layer 145 everywhere and particularly the surface areas of the VMOSFET 10 except those areas 135 and 140 exposing buried contacts (BC) for the gate and source respectively this will be used to create the depletion load device or transistor 20 for subsequent n-type introduction at area 80 through sidewall area 115B" and a predetermined portion of top area 125B" that is adjacent to and forms an elbow with sidewall area 115B". The preferred n-type introduction in this embodiment being depletion implantation. The n-type area 80 will be operative to be the channel region for the second transistor 20 of the VMOSFET 10.

In the twelfth step of the process, as shown in cross-sectional view 14A and in overhead view 14B, the photoresist layer 145 is removed by etching in the preferred embodiment. Next, doped polysilicon is introduced through deposition, in the preferred embodiment, to a predetermined depth and then a photo process with masking is used to define a first-layer polysilicon pattern to be used as the polysilicon gate area 30 of the second transistor 20. In addition, the first-layer polysilicon pattern is further used to define the polysilicon area 137 for interconnections between area 45 and infra electrode 70. It will be noted that area 137 is optional and is only used because N+ area 45 may be shallow and thus might other wise short out. The gate area 30 is operative to cover BC 130, a predetermined part of bottom area 120", sidewall area 115B" and a predetermined part of top area 125B". The preferred predetermined depth of polysilicon in this embodiment approximates 4500 Angstroms. It will be appreciated that the buried contact (BC) 130 is defined by a non-critical mask because doped polycrystaline silicon 30 and 137 is used as the doping source.

Figure 14A:
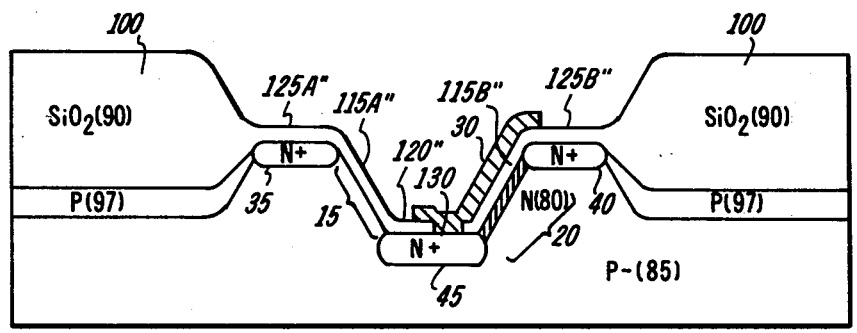
FIG. 14A is a cross-sectional view of the photoresist removal twelth step for the VMOSFET of FIG. 1.
Figure 14B:
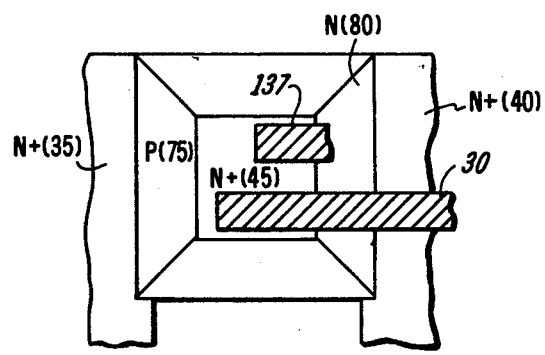
FIG. 14B is an overhead view of the photoresist removal twelth step for the VMOSFET of FIG. 1.
Figure 15:
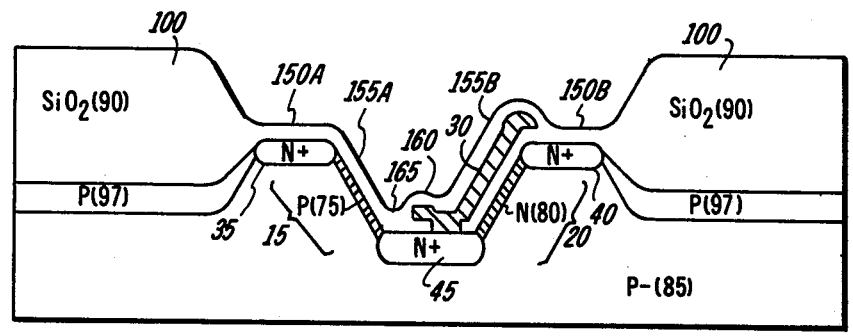
FIG. 15 is a cross-sectional view of the silicon dioxide removal thirteenth step for the VMOSFET of FIG. 1.

In the thirteenth step of the process, as shown in cross-sectional view FIG. 15 and the same overhead view as the supra FIG. 14B, the SiO2 of first gate oxide comprising those areas not covered by the supra polysilicon gate area 30 or specifically top areas 125A", sidewall area 115A', part of bottom area 120" and part of top area 125B", are removed, through etching in the preferred embodiment. Regrowing, through oxidation in the preferred embodiment, through a relatively high temperature is used to grow SiO2 to a predetermined depth as a second gate oxide over all supra areas where oxide was removed by etching plus the polysilicon gate area 30 itself. The new areas for VMOSFET 10 being top areas 150A–B, sidewall areas 155A–B and bottom area 160. The preferred depth of SiO2 in this embodiment approximates 1000 angstroms. Next, a p-type enhancement introduction is made through sidewall area 155A as a p-type area 75 which is the channel region for transistor 10 of the VMOSFET 10. The preferred introduction in this embodiment being implantation.

Figure 16A:
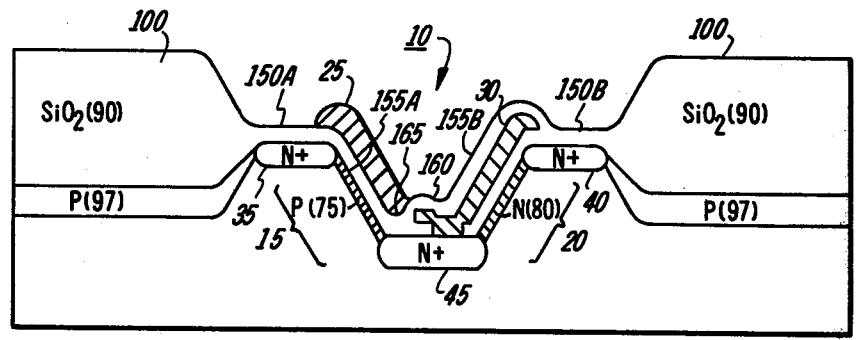
FIG. 16A is a cross-sectional view of the polysilicon introduction fourteenth step for the VMOSFET of FIG. 1.
Figure 16B:
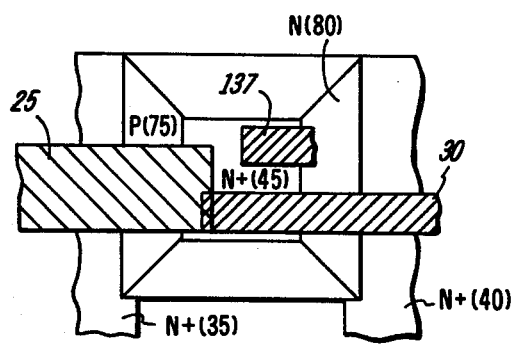
FIG. 16B is an overhead view of the polysilicon introduction fourteenth step for the VMOSFET of FIG. 1.

In the fourteenth step of the process, as shown in cross-sectional view FIG. 16A and in overhead view 16B, doped polysilicon is presented or introduced, through deposition in the preferred embodiment, to a predetermined depth as the polysilicon gate area 25 for the transistor 15. A photo process with masking is used to define the exact polysilicon gate area or second-layer gate area 25 such that it covers a predetermined portion of the top area 150A near the adjacent elbow with the sidewall area 155A, the sidewall area 155A itself, and a predetermined portion of the bottom area 160 near the adjacent elbow with the sidewall area 155A. It will be noted that there is a depression 165 in the bottom area 160 where the polysilicon gate area 25 which serves as the repository which the lower end of the polysilicon gate area 25 covers. In addition, it also acts to give the polysilicon gate area 25 a slight spaced overlapping effect relative to the other gate area 30 from which it is of course spatially split apart therefrom. The preferred predetermined depth of polysilicon for the gate area 25 in this embodiment is approximately 3000 angstroms.

Figure 17A:
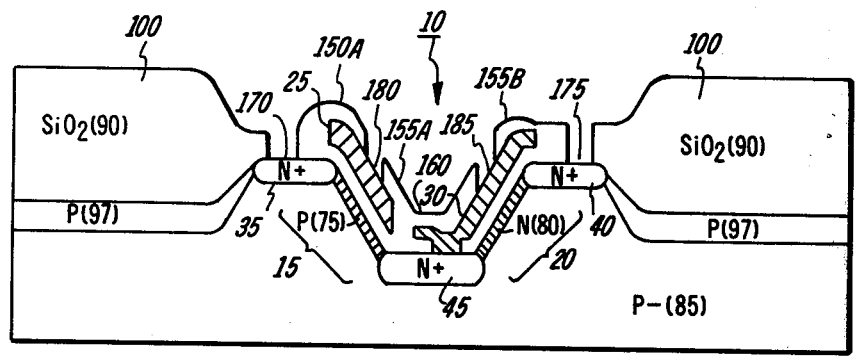
FIG. 17B is an overhead view of the silicon dioxide introduction fifteenth step for the VMOSFE of FIG. 1.
Figure 17B:
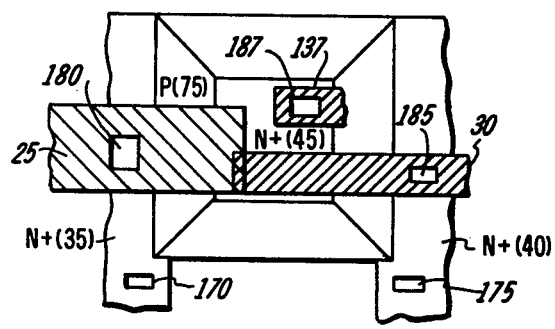

In the fifteenth step of the process, as shown in cross-sectional view FIG. 17A and in overhead view 17B, introduction of silicon dioxide is made, through deposition (either PVX-phosphor vapor oxide or CVD-chemical vapor deposition) in the preferred embodiment, and subsequently reflowed, followed by photo process with masking to open contacts or apertures 170, 175, 180, 185 and 187 through top areas 150A–B, sidewall areas 155A–B and bottom area 160 to source N+ area 35 for transistor 15, drain N+ area for transistor 20, polysilicon gate area 25 for transistor 15, polysilicon gate area 30 for transistor 20, and polysilicon interconnection area 137 respectively.

Figure 18A:
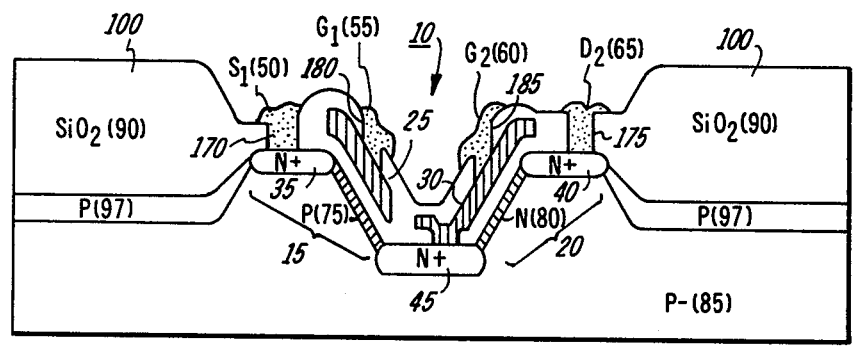
FIG. 18A is a cross-sectional view of the conductive material introduction sixteenth step for the VMOSFET of FIG. 1.
Figure 18B:
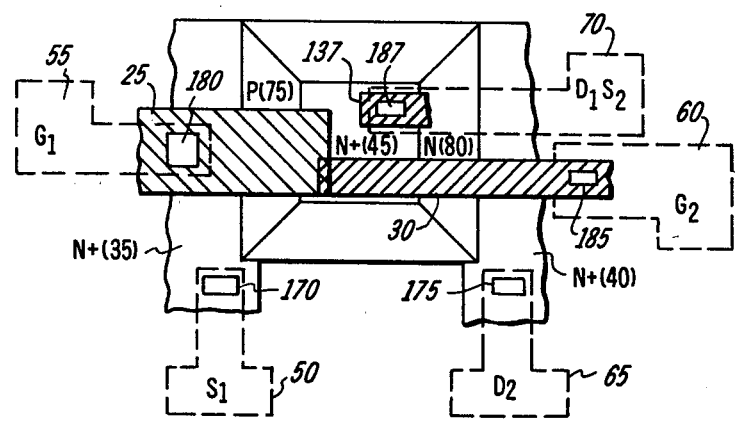
FIG. 18B is an overhead view of the conductive material introduction sixteenth step for the VMOSFET of FIG. 1.

In the sixteenth step of the process, as shown in cross-sectional view FIG. 18A and in overhead view 18B, introduction or presentation is made of conductive top material as patterns over and on the entire surface of the VMOSFET 10. In the preferred embodiment, the application or introduction is by deposition and the conductive material is aluminum metal. Next, a photoprocess with masking is used to define the metal or conductive patterns or electrodes or terminals 50, 65, 55, and 60 as being particularly proximate thereto and approximately within the supra apertures 170, 175 and 185 for use as the electrode or terminal for source (S1) of transistor 15, drain (D2) of transistor 20, gate (G1) of transistor 15, and gate (G2) of transistor 20, respectively.

It will be appreciated that all n-type material can be substituted for p-type material and vice versa. It will be further appreciated that the complete fabrication process supra requires the same number of masks as a conventional planar NMOS process.

It will also be further appreciated that prior art VMOS devices were design limited by nonsymmetrical geometry and as a result no transfer gate could be designed using those prior art devices. The present invention does have symmetrical device geometry and as a result gate transfer can easily be implemented. Specifically, for transistor 15 source and drain designations for N+ areas 35 and 35 may be reversed and therefore are symmetrical. Likewise, transistor 20 source and drain designations for N+ areas 45 and 40 may be reversed and therefore are symmetrical.

In addition, it will be also further noted, this technology allows double diffusion of different impurity types (N and P types) to form a new device structure for VMOSFET 10 with an even shorter channel region length 75 and 80 which leads to higher gain and space capability and large charge storage capability per unit area.

While the above referenced embodiments of the invention have been described in considerable detail with respect to the apparatus, it will be appreciated that other modifications and variations therein may be made by those skilled in the art without departing from the true spirit and scope of the invention.

What is claimed is:

1. A method for making a split gate VMOSFET that resides on a p minus substrate comprising the steps of:
   (a) etching, according to a mask pattern, to define a v-groove region in the P minus substrate, having a bottom area, first and second sidewall areas and first and second top areas, and growing a layer of silicon dioxide on the first and second top areas, first and second sidewall areas and the bottom area of the V-groove region;
   (b) first implanting a relatively heavy n-type impurity to form, in the p minus substrate, n+ areas in the first and second top areas and the bottom area;
   (c) removing the layer of silicon dioxide on the first and second top areas, the first and second sidewall areas and the bottom area, regrowing a new layer of silicon dioxide, and opening buried contacts through the silicon dioxide layer to the N+ area in the bottom area;
   (d) masking the V-groove region to block all except the silicon dioxide layer adjacent to the second sidewall and a first part of the buried contact for n-type implementation to define a first channel region in the P minus substrate relatively proximate to the second sidewall area;
   (e) depositing doped polysilicon and masking away to define a first gate area proximate to the second sidewall area, removing the layer of silicon dioxide not covered by the doped polysilicon and regrowing a new layer of silicon dioxide thereon, p-type introduction enhancement into the p minus substrate proximate to the first sidewall area to define a second channel region, and depositing doped polysilicon for masking away to define a second gate area proximate to the first sidewall area, that is split apart from and spatially overlapping the first gate area; and
   (f) second implanting and reflowing a new layer of silicon dioxide in the V-groove region, and then masking the new silicon dioxide layer to open contacts to the N+ area in the first and second top areas, and the first and second gate areas.

2. The method of claim 1 wherein said growing step is accomplished by oxidizing.

3. The method of claim 1 wherein there growing in said removing step is accomplished by oxidizing.

4. The method of claim 1 wherein the masking step precludes the second top area relatively adjacent to the second sidewall area.

5. The method of claim 1 wherein the masking step precludes the bottom area adjacent to the second sidewall area.

6. The method of claim 1 wherein the masking step preclude a second part of the buried contact in the bottom area.

7. The method of claim 1 wherein the regrowing in the depositing step is accomplished by oxidizing.

8. The method of claim 1 wherein the N+ area in the first top area of the first implanting step is a source area for an enhancement transistor.

9. The method of claim 1 wherein the N+ area in the first top area of the first implanting step is a drain area for an enhancement transistor.

10. The method of claim 1 wherein the N+ area in the second top area of the first implanting step is a drain area for a depletion load transistor.

11. The method of claim 1 wherein the N+ area in the second top area of the first implanting step is a source area for a depletion load transistor.

12. The method of claim 1 wherein N+ area in the bottom area of the first implanting step is a common drain for an enhancement transistor and source for a depletion load transistor.

13. The method of claim 1 wherein the N+ area in the bottom area of the first implanting step is a common source for an enhancement transistor and drain for a depletion load transistor.

14. The method of claim 1 wherein the first channel region of the masking step is used in a depletion load transistor.

15. The method of claim 1 wherein the second channel region of the depositing step is used in an enhancement transistor.

16. The method of claim 1 wherein the first gate area of the depositing step is used in a depletion load transistor.

17. The method of claim 1 wherein the second gate area of the depositing step is used in an enhancement transistor.

18. The method of claim 1 wherein the silicon dioxide layer depth in the removing step is greater for the first and second sidewall areas then the first and second top areas and bottom areas.

19. The method of claim 1 wherein the masking step exceptions include a second part of the buried contact in the bottom area, and depositing doped polysilicon with masking away to define a polysilicon interconnection to the N+ area in the bottom area.

20. The method of claim 1 including the additional step of applying a conductive material to the contacts to the N+ areas in the first and second top areas, and the first and second gate areas for use as terminals.

21. The method of claim 2 wherein the oxidizing in said growing step is accomplished at a temperature that is low relative to ambient.

22. The method of claim 3 wherein the oxidizing in said growing step is accomplished at a temperature that is high relative to ambient.

23. The method of claim 7 wherein the regrowing by oxidizing in the depositing step is accomplished at a temperature that is low relative to ambient.

24. The method of claim 22 wherein the masking step includes presenting and reflowing a new layer of silicon dioxide in the V-groove region, and then masking the new silicon dioxide layer to open a contact to the polysilicon interconnection.

25. The method of claim 20 wherein the conductive material in the applying step is aluminum.

26. The method of claim 20 wherein the applying step is by deposition.

27. The method of claim 24 including an additional step of applying a conductive material to the contact to the polysilicon interconnection in the bottom area for use as a terminal.

28. The method of claim 27 wherein the conductive material in the applying step is aluminum.

29. The method of claim 28 wherein the applying step is by deposition.

30. A method for making a split gate VMOSFET that resides on an n minus substrate comprising the steps of:
  (a) etching according to a mask pattern to define a v-groove region in the N minus substrate having a bottom area, first and second sidewall areas and first and second top areas, and growing a layer of silicon dioxide on the first and second top areas, first and second sidewall areas and the bottom area of the V-groove region;
  (b) introducing a relatively heavy p-type impurity to form, in the N minus substrate, p+ areas in the first and second top areas and the bottom area;
  (c) removing the layer of silicon dioxide on the first and second top areas, the first and second sidewall areas and the bottom area regrowing a new layer of silicon dioxide, and opening buried contacts through the silicon dioxide layer to the P+ area in the bottom area;
  (d) masking the groove region to block all except the silicon dioxide layer adjacent to the second sidewall and a first part of the buried contact for P-type introduction to define a first channel region in the N minus substrate relatively proximate to the second sidewall area.
  (e) depositing doped polysilicon and masking away to define a first gate area proximate to the second sidewall area, removing the layer of silicon dioxide not covered by the doped polysilicon and regrowing a new layer of silicon dioxide thereon, introducing N-type enhancement into the N minus substrate proximate to the first sidewall area to define a second channel region, and depositing doped polysilicon for masking away to define a second gate area proximate to the first sidewall area, that is split apart from and spatially overlapping the first gate area; and
  (f) presenting and reflowing a new layer of silicon dioxide in the v-groove region, and then masking the new silicon dioxide layer to open contacts to the P+ areas, the first and second top areas, and the first and second gate areas.

* * * * *